United States Patent [19]

Ahearn et al.

[11] Patent Number: 4,788,382

[45] Date of Patent: * Nov. 29, 1988

[54] DUPLEX GLASS PREFORMS FOR HERMETIC GLASS-TO-METAL COMPRESSION SEALING

[75] Inventors: John E. Ahearn, Middleboro; Raymond A. Frates, Fairhaven; Dennis Girard; Richard A. Koepke, both of New Bedford; Robert M. O'Hern, Taunton, all of Mass.; James K. Schmidt, Mt. Pleasant; C. Dodd Manon, Ligonier, both of Pa.

[73] Assignee: Isotronics, Inc., New Bedford, Mass.

[*] Notice: The portion of the term of this patent subsequent to Dec. 29, 2004 has been disclaimed.

[21] Appl. No.: 51,664

[22] Filed: May 18, 1987

[51] Int. Cl.$^4$ .............................................. B32B 17/06
[52] U.S. Cl. ........................... 174/52 FP; 174/50.61; 428/432; 501/32; 501/68
[58] Field of Search ........ 174/52 FP, 50.61, 152 GM; 501/32, 68; 428/432, 433, 434; 357/74

[56] References Cited

U.S. PATENT DOCUMENTS

| | | | |
|---|---|---|---|
| 4,186,023 | 1/1980 | Dumesnil et al. | 106/53 |
| 4,430,376 | 2/1984 | Box | 428/174 |
| 4,587,144 | 5/1986 | Kellerman et al. | 174/50.61 X |
| 4,716,082 | 12/1987 | Ahearn et al. | 174/52 S X |

Primary Examiner—Arthur T. Grimley
Assistant Examiner—David A. Tone
Attorney, Agent, or Firm—Weingarten, Schurgin, Gagnebin & Hayes

[57] ABSTRACT

A duplex glass preform for forming hermetic glass-to-metal seals of the compression type. The duplex glass preform comprises a glass infrasturcture or matrix having at least one end thereof modified by the selective distribution therein of ceramic particles. The ceramic particles are selectively distributed to form a ceramic density gradient having the largest concentration of ceramic particles at the surface and gradually decreasing with depth. The duplex glass preform of the present invention has utility in forming glass-to-metal compression seals in hybrid metal packages containing microcircuit chips. The duplex glass preform may be used in the normal insulative fashion or as a conductive member.

18 Claims, 1 Drawing Sheet

DUPLEX GLASS PREFORMS FOR HERMETIC GLASS-TO-METAL COMPRESSION SEALING

REFERENCE TO RELATED APPLICATION

This application is related to U.S. Pat. application Ser. No. 924,057 filed Oct. 28, 1986, now issued as U.S. Pat. No. 4,716,082, for "Duplex Glass Preforms for Hermetic Glass-to-Metal Sealing."

FEILD OF THE INVENTION

This invention relates to glass preforms for use in forming hermetic glass-to-metal seals, and more particularly to duplex glass preforms useful in forming compression type seals of improved strength and toughness.

BACKGROUND OF THE INVENTION

Hybrid metal packages have been used for many years to hermetically protect hybrid and semiconductor discrete and integrated circuit chips. The chips are mounted within the eyelet or body of the package and are electrically connected to external circuitry by means of conductive leads or pins passed through apertures in the body. To ensure hermetic sealing and to preclude short circuiting between the lead or pins and the metallic package, the leads or pins are sealed in glass and the glass-pin combination is sealed in the body.

The formation of hermetic compression type glass-to-metal seals as exemplified in U.S. Pat. Nos. 3,370,874, 3,600,017, and 4,008,945 utilize glass and metal components possessing intentionally mismatched coefficients of thermal expansion (CTE) so that as thermal energy is applied and removed during seal formation and during subsequent operational use, the glass and metal components expand and contract, respectively, at different rates. Hermeticity in glass-to-metal compression seals is achieved, without bonding, by the compressive forces or physical stresses created between the components by the dissimilar rates of contraction and expansion.

In practice, compression seals formed between stainless steels and suitable "compression" type glasses may be achieved with a compliant metal such as nickel or copper electroplated or sputtered onto the surface of the stainless steel to form a metallic pad or film. A thin plated-on metallic pad is considered beneficial in reducing glass cracking tendencies, although the fact that stainless steel, iron, nickel-iron, or low carbon steel are often compression sealed without the aid of intermediate metal films indicates that such procedures are not absolutely essential. Such films are more likely to be used in the event that the sealed metal is composed of nickel-iron, or iron where corrosion is a consideration.

Compression type glass-to-metal seals are manufactured using a wide range of glass components and metal bases. For example, hybrid packages fabricated from soft steel and pins of nickel-iron alloys such as number 52 alloy are often sealed using a Corning type 9008 or other equivalent "soft" glasses.

Many more vitreous or soft glasses are available for compression glass-to-metal sealing than the devitrified or hard type glasses which are utilized in matched glass-to-metal sealing. A common distinction between hard and soft glasses is that glasses having low coefficients of thermal expansion and contraction are considered "hard", while those having high coefficients of thermal expansion/contraction are considered "soft". There is some degree of overlap in the designation of glasses, however, and such notables as U.H. Partridge have referred to certain "low" CTE glasses of the borosilicate type as being soft. A language constraint between softness and toughness is a major cause of such ambiguity.

Hermeticity in matched glass-to-metal seals, in contrast, is achieved by molecular bonding between the glass and metal components. The surfaces of the metal components which interface with the glass are preconditioned prior to the sealing operation by the controlled growth of munsel-grey oxide on the interfacing surfaces of the metallic components. Sealing is subsequently effected by applying thermal energy to partially fluidize the glass so that it wets or flows over the oxide. As thermal energy is withdrawn from the heated components, i.e., cooldown, molecular bonding occurs between the glass and oxide. The oxide is mutually soluble in both the glass and metal components. The metallic oxide, metal and glass components forming the stabilized glass-to-metal seal have substantially matching CTEs over a wide temperature range in matched seals.

Glass-to-metal compression seals, in contrast, do not require preoxidation of the metal elements comprising the seal because molecular bonding is not required to effect a hermetic seal. Rather, hermeticity is achieved in glass-to-metal compression seals due to the physical stresses created by the mismatch in CTEs of the metal body, the glass inserts, and the metallic electrical conductors. The metal body or outer member has the highest CTE, the glass insert has an intermediate CTE and the conductor has the lowest CTE such that during cooldown after firing the body contracts in on the glass insert at a faster rate than the glass insert is contracting in on the conductor. The mismatch in CTEs between the body-glass insert and the glass insert-conductor creates tremendous compressive forces therebetween with the result that hermeticity is achieved without bonding.

FIG. 1 exemplifies a compression type glass-to-metal 10 seal of the prior art wherein a soft glass preform 12 is sealed to a nichel-iron alloy such as number 52 alloy terminal pin or lead 14 along interfacing surface 16 and to a stainless steel or soft steel alloy body 18 along interfacing surface 20. Positive menisci 22, 24 are formed at the ends of the interfaces 16, 20, respectively, i.e., at the boundary of the interfaces with the environment.

A large percentage of hybrid metal packages find end use in both high-tech industrial and governmental applications. It is, therefore, more efficacious, as a practical manner, to subject hybrid metal packages to quality control (QC) acceptance testing using QC standards meeting or exceeding government QC standards, rather then segregating hybrid metal package lots according to end use and then QC testing using different criteria. Not only would the latter procedure increase the overall production time and cost, necessitating for example tighter package lot control and segregation and recalibration or duplication of QC gear, but it would also vitiate the fungibility of finished metal packages.

Hybrid metal packages are generally subjected to four broad areas of QC testing: visual/mechanical; electrical; environmental; and line. Hybrid packages subjected to mechanical forces such as acceleration, shock, or vibration, either during QC testing or in field use, have been found to experience a certain degradation in physical integrity.

Due to the partial fluidization and resolidification of the boundary layers of glass at the interfaces 16, 20 and at environmentally-exposed surfaces during the firing process, compressive skin stresses are set up in the outer layers of the glass preform 12. Exacerbating this condition are the inherent compressive stresses existing in the glass 12 and metallic elements 14, 18 due to the mismatch in CTEs. When subjected to mechanical forces glass-to-metal compression seals 10 of the prior art have been found to be adversely affected by crack or fracture formation and glass chip-out.

Of particular concern are the glass menisci 22, 24 formed during the sealing operation, these menisci being brittle and of relatively low toughness, strength and ductility. The menisci 22, 24 are subject to the highest concentration of compressive skin stresses due to their structural configuration. The meniscus 22, formed at the interface 16 between the glass 12 and the terminal pin 14, is especially vulnerable since most of the mechanical forces experienced by the hybrid packages are transmitted by means of the terminal pins or leads 14.

The largest single cause of hybrid metal packages rejections during visual inspections results from spreading meniscus cracks which exceed fifty percent of the distance from the terminal pin 14 to the eyelet 18 and/or glass chip-out from the meniscus 22.

A typical propagation route 26 for a meniscus crack is shown graphically in FIG. 2. In general, a crack, once formed in the meniscus 22, proceeds inwardly into the glass 12 for some distance, and then at some point hooks back towards the surface of the meniscus 22, such that the crack propagation route 26 is generally "fishhook" in shape, as viewed in cross-section in FIG. 2. The crack propagation route 26 is shown generally as A-B-C-D-E-F-G. A glass chip-out is shown generally at 28 and represents a segment of glass lost from the glass-to-metal seal as a result of a smaller completed fishhook crack.

Cracks or fractures formed in the meniscus, or chip-out losses from the meniscus, may adversely affect the physical integrity of hybrid metal packages. Theoretically, all hermetic packages leak to a certain extent. A "hermetic" package is pragmatically defined as one having an acceptable leak rate, and for most applications the hermeticity is satisfactory if the leak rate is equal to or less than $1 \times 10^{-8}$ cubic centimeters of helium per second at a pressure differential of one atmosphere. Cracks or chip-outs in the meniscus may cause the package to have a leak rate greater than $1 \times 10^{-8}$ cc/He/sec.

Compression and matched glass-to-metal seals are generally subjected to a salt atmosphere during QC environmental testing. The salt atmosphere will readily penetrate any chip-outs or cracks formed in the meniscus, and if the penetration is sufficient to contact the terminal pin or lead, a corroding action will be engendered thereon. A corroded pin or lead may eventually result in the degradation or complete failure of the hybrid package.

Various solutions have been propounded to reduce the complications arising from meniscus cracking or chip-out loss. These include pressing the glass flat in the meniscus area, treating the glass surface with buffered or unbuffered fluoride ions, undersealing to reduce the degree of meniscus wickup and fire polishing at a slightly lower temperature than the fluidizing temperature during sealing. These solutions not only increase the cost of glass-to-metal seals, but in some cases adversely affect the characteristics of the glass-to-metal seal.

Another approach involves capping the glass preform with a solid ceramic disk. The solid ceramic disk and glass, which in combination comprise the preform, however, have dissimilar CTEs such that when the solid ceramic capped glass preform is subjected to thermal shock or extremes in temperature cycling, the solid ceramic disk and the glass preform expand and contract at different rates due to the differences in CTEs. The disparity in expansion and contraction leads to crack or fracture formation and/or separation along the interface between the solid ceramic disk and glass preform, which makes the glass-to-metal seal generally nonfunctional for its intended purpose.

SUMMARY OF THE INVENTION

The present invention surmounts the inherent disadvantages of the prior art by providing a duplex glass preform for use in forming compression glass-to-metal seals having enhanced strength and toughness. The infrastructure or matrix of the preform is comprised of a glass having utility in the formation of compression type glass-to-metal seals. Corning 9013 glass is one such representative glass having utility in forming compression seals. Corning 9008 glass, used in combination with soft steel, provides another illustration of a glass having utility in forming compression seals.

Ceramic particles are selectively distributed in at least one end of the preform in a dispersion zone. It is to be understood that ceramic particles as used herein is a generic term, encompassing ceramic bodies having an essentially two dimensional configuration, i.e., flakes, as well as ceramic bodies having an essentially three dimensional configuration, i.e., particles. Selective distribution in the dispersion zone is controlled in two respects. First, the ceramic particles are distributed so as to have a gradually decreasing density gradient with depth, with the highest concentration or density of ceramic particles occuring at the end surface of the preform. Second, though a small number may be present, no ceramic particles are added in the boundary layer adjacent the interface or interfaces with metal components.

The duplex glass preform, according to the present invention, forms compression type glass-to-metal seals of improved toughness and strength. In addition, compression type glass-to-metal seals according to the present invention provide several orders of magnitude improvement in hermeticity, with leak rates of about $2 \times 10^{-9}$ or lower cc/He/sec being obtained. The selectively distributed ceramic particles limit the glass volume available for wetting at the glass-metal interfaces during sealing such that compression glass-to-metal seals, according to the present invention, have greatly reduced menisci. The ceramic particles inhibit the formation of meniscus cracks or fractures, and further act to confine any meniscus cracks or fractures formed to an extremely small zone, thereby significantly reducing the probability of deleterious effects from meniscus cracks and greatly reducing chip-out loss.

BRIEF DESCRIPTION OF THE DRAWINGS

A more complete understanding of the present invention and the attendant advantages and features thereof will be more readily appreciated as the same becomes better understood by reference to the following detailed description when considered in conjunction with the accompanying drawings wherein.

DETAILED DESCRIPTION OF THE PREFERRED EMBODIMENTS

Figure 1:
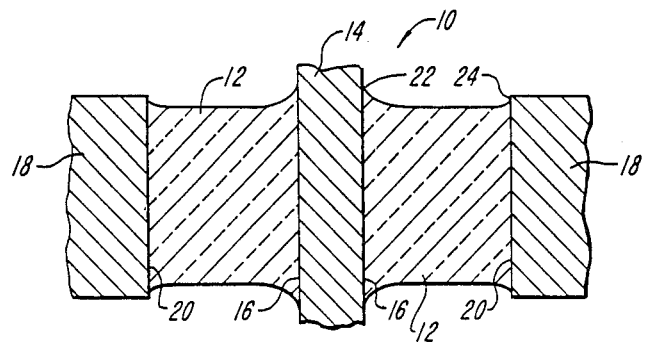
FIG. 1 is a partial cross-sectional view of a prior art glass-to-metal compression seal.
Figure 2:
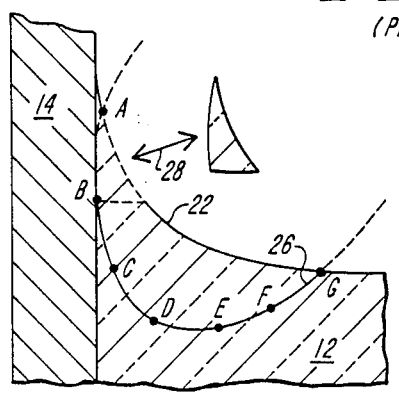
FIG. 2 is an expanded cross-sectional view of a prior art meniscus illustrating crack propagation and glass chip-out.
Figure 3A:
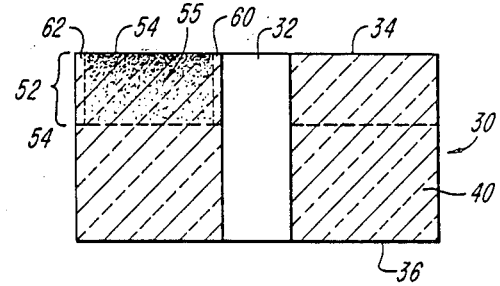
FIG. 3A is a cross-sectional view of a duplex glass preform according to the present invention.
Figure 4:
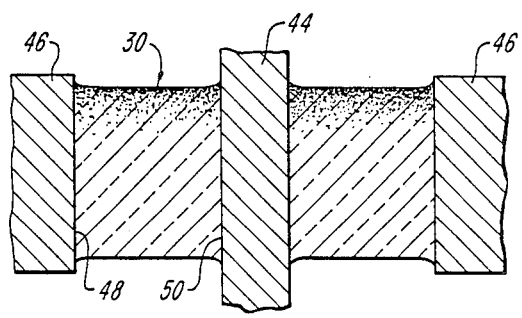
FIG. 4 is a partial cross-sectional view of a compression type glass-to-metal seal according to the present invention.

Referring now to the drawings, wherein like reference numerals designate similar or corresponding elements throughout the several views, there is shown generally in FIG. 3A one embodiment of a duplex glass preform 30 according to the present invention. The preform 30 of FIG. 3A is adapted for forming compression glass-to-metal seals in hybrid microcircuit packages. The preform 30 is generally cylindrical in external configuration and has one or more terminal bores 32, each bore 32 adapted to receive a conductive lead or terminal pin 44, as shown in FIG. 4. For most hybrid package applications, preforms 30 have a cylindrical length in the range of about 40 mils to about 80 mils. Typically, one end 34 of the preform 30 will be exposed to an uncontrolled environment while the other end 36 will be exposed to the controlled environment of the hybrid package interior.

A compression type glass-to-metal seal utilizing the preform 30 of FIG. 3A is exemplified in FIG. 4. The metallic terminal pin 44 is sealed within the preform 30, which is sealed to a metallic body or eyelet 46 of the hybrid package. The body 46 is the basic metal structure of the hybrid package and has a predetermined pattern of holes therein for receiving pin 44-containing preforms 30. Interfaces 48, 50 are defined between the preform 30 and the eyelet 46 and the terminal pin 44, respectively.

Referring back to FIG. 3A, the preform 30 of the present invention is a duplex composition. The infrastructure or matrix of the preform 10 is a glass 40 having utility in the formation of compression type metal-to-glass seals. For glass-to-metal compression seals, the thermal coefficient of expansion of the glass 40 is intentionally mismatched with respect to the thermal coefficient of expansions of the metals comprising the terminal pin 44 and the body 46. Corning 9010 or 9013 glasses are representative glasses well known for utility in the formation of glass-to-metal compression seals. Other suitable sealing glasses are available for use with molybdenum, tantalum, tungsten and other conductive metals.

One skilled in the art will appreciate that the terminal pins 44 and the body 46 may be fabricated from a variety of different metals. For example, the body 46 may be fabricated from stainless steel or soft steel alloys while the terminal pins 44 may be fabricated from nickel-iron alloys. In selecting glasses and metals for use in glass-to-metal compression seals, the controlling consideration is the relative mismatch between the CTEs of the materials selected, i.e., the $CTE_{body}$ is generally greater than the $CTE_{glass\ preform}$ which in turn is generally greater than the $CTE_{conductor}$.

A dispersion zone 52 is delineated or defined at the uncontrolled environmental end 34 of the preform 30, as shown in FIG. 3A. The depth of the dispersion zone 52 is measured axially inwardly from the surface of the end 34. The depth range for the dispersion zone is from about 3 mils to about 15 mils, and has a preferred depth range of about 5 mils, plus or minus about 1 mil. Thus, for the preferred depth range, the dispersion zone 52 constitutes about 6 to about 13 percent of the overall length of the preform 30, relative to an average bead or preform length of 0.050. It is to be understood that a second dispersion zone, equivalent to the dispersion zone 52, may be delineated at the controlled environmental end 36 of the preform 30 where packaging requirements so dictate, and that different dimensional requirements relative to the glass preform are considered equally.

Ceramic particles 54 are selectively distributed or added in the glass 40 matrix within the dispersion zone 52, as shown in FIG. 3A, to form a supersaturated or modified glass 55. For purposes of illustration only, one-half of the dispersion zone 52 shown in cross-section in FIG. 3A does not have ceramic particles 54 selectively distributed therein. Ceramics, as used herein, includes the complex aluminosilicates or silicoaluminates, beryllia, and alumina. The ceramic particles 54 may be reinforced by having whiskers of silicon carbide dispersed therein. For a glass 40 matrix comprised of Corning 9013 glass, ceramic particles 52 of alumina, $Al_2O_3$, are most advantageously employed. Thus, the duplex preform 30 according to the present invention comprises the glass 40 of the matrix and the modified glass 55 of the dispersion zone 52.

Figure 3B:
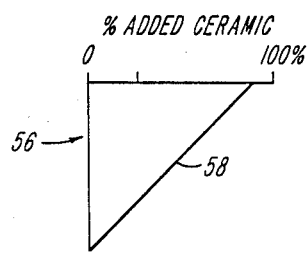
FIG. 3B is an added ceramic density gradient profile.

The ceramic particles 54 are selectively added to the glass 40 in such manner that a ceramic density gradient profile 56, depicted generally in FIG. 3B, is created. A slope 58 of the ceramic density is preferably approximately linear so that there is a gradual transition in concentration or density of ceramic particles 54 with depth. The gradual transition in density eliminates fracture or cleavage planes within the dispersion zone 52 which would impair the physical integrity of the preform 30. The concentration or density of added ceramic particles 54 is greatest at the surface of end 34, gradually decreasing to zero at the other boundary defining the dispersion zone 52. The percentage of added ceramic particles 54 may be as high as 60 percent by weight of the total preform 30 weight, depending upon bead size and configuration. Thus, in describing ceramic particles 54 added to the glass 40 comprising the matrix, it is to be understood that these ceramic particles 54 are over and above any similar particulate material normally contained in the glass 40.

By way of illustration only, for a preform 30 comprised of soft glass 40 having alumina particles 54 distributed in the dispersion zone 52, the approximate percentage ranges for added alumina particles 54 is: about 75 percent to about 90 percent at the surface layer; about 60 percent to about 75 percent at a depth of about 2 mils; and less than about 15 percent to about 25 percent at a depth of about 5 mils. By a depth of about 10 mils to about 15 mils, the percentage of added alumina particles 54 is about zero.

Formation of the ceramic density gradient is facilitated by controlling the size-grade of ceramic particles 54 distributed within the glass 40. The greatest accumulation of ceramic particles 54 are added at the surface of end 34, with succeedingly less volume of particles distributed with increasing depth. The preferred range of grades for ceramic particles 54 is about 50 microns to about 200 microns, fine-to-coarse. This grade range ensures that the ceramic particles 54-glass 40 combination or modified glass 55 of the dispersion zone 52 is not deleteriously affected when subjected to thermal shocks or temperature cycling due to dissimilarities in CTEs between the added ceramic particles 54 and the glass 40.

The addition of ceramic particles in a glass matrix causes a reduction in the wetting or flow characteristics of the ceramic-glass combination by reducing the surface tension of the modified glass 55. Hermeticity in glass-to-metal compression seals is achieved by the physical stresses created between the glass and the terminal pin 44 and the body 46. To ensure the requisite close conformal contact of the surfaces of the terminal wire 44 and body 46 over the interfaces 50, 48, respectively, relatively ceramic-free zones 60, 62 are formed adjacent the dispersion zone 52 adjacent interfaces 50, 48, respectively. The ceramic-free zone 60, 62, as the name indicates, contain no added ceramic particles 54, but it is to be understood, may contain ceramic material dispersed in solid solution in the glass 40, depending upon the glass 40 and the ceramic particles 54 combination selected.

Surface tension and volume affect the conformal characteristics of glass. As the preform 30 of the present invention is partially fluidized by heating during the sealing operation, the surface tension of the glass 40 adjacent interfaces 48, 50 is reduced such that the glass 40 compresses and conforms to surfaces of the terminal wire 44 and body 46. The compression conforming of the surface is sufficient to ensure a tight fit therebetween. At the same time the modified glass 55, by means of the added ceramic particles 54, limits the volume of glass 40 available for conforming to the surfaces of the body 46 and the terminal pin 44 adjacent the dispersion zone 52. The net result is that while a directional stress distribution is achieved, there is a concomitant significant reduction in size of the meniscus formed. By appropriate control of the density gradient of the ceramic particles 54, the menisci at the interfaces 48, 50 of the end 34 may be almost completely eliminated.

The duplex preform 30, according to the present invention, may be fabricated by methods known to those skilled in the art. Multi-constituent pill making machines, for example, may be readily adapted for forming duplex preforms 30. Powdered glass 40 and a graded composition of ceramic particles 54 are suitably disposed in the machine molds and then loosed pressed to form molded preforms. The molded preforms are then sintered at temperatures of about 300° to 700° C. to form the duplex preform 30 of the present invention.

The duplex preform 30 of FIG. 3A is advantageously utilized in the fabrication of hybrid metal packages having compression type glass-to-metal seals. In a one or two step operation the terminal pin 44 is disposed in the terminal bore 32 of the preform 30 with the chemically cleaned surface of the terminal pin 44 adjacent interface 50. The terminal pin 44-preform 30 is disposed in an aperture of the body 46 adjacent interface 48. Sealing is accomplished by heating the loosely assembled combination to a temperature somewhat above the melting point of the glass 40. This temperature is maintained for a time sufficient to ensure fluidization of the boundary layers of the glass 40, that is a fluidized conformiality at the interfaces 48, 50. Any "wetting" of the glass to unoxidized metal is superficial. Upon cooldown to room temperature, compressive stress bonding occurs at the interfaces 48, 50 to form a hybrid metal package having a compression type glass-to-metal seal.

It has also been determined that there is a dramatic increase in hermeticity for hybrid metal packages fabricated with duplex preforms according to the present invention. A pragmatically acceptable hermeticity for most applications is a leak rate of $1 \times 10^{-8}$ cc/He/sec at a pressure differential of one atmosphere. Leak checking of hybrid metal packages formed, according to the present invention, revealed leak rates an order of magnitude lower than the pragmatically acceptable leak rate, i.e., leak rates of about $1 \times 10^{-9}$ to $10^{-10}$ cc/He/sec at a pressure differential of one atmosphere. The enhanced hermeticity of hybrid metal packages utilizing duplex preforms according to the present invention is attributed to an increase in compressive skin stress engendered by the addition of ceramic particles.

In another embodiment of the present invention the terminal pins 44 disposed in the duplex preform 30 are plated with one or more corrosion-resistant materials. In general, glass may be successfully compression bonded to a metal which is not oxidized. In fact, a clean smooth surface is much preferred. To prevent corrosion, the pins 44 and eyelets may be plated with a variety of metals, or combinations thereof, which act as a compliant member to aid in promoting leak tight compression seals.

A stainless steel or Fe alloy, by way of example, may be clad with about 100 to about 150 microinches of substrate nickel and about 50 microinches of a noble metal such as palladium or gold to reduce susceptibility to corrosion.

The majority of terminal pins in hybrid metal packages are electrically connected to terminal areas of the microcircuit chips embodied therein. However, at least one terminal pin will often function as a ground lead. This terminal pin is grounded by strapping or electrically connecting the interior portion of the terminal pin to the package body. This grounding operation may be more readily facilitated by utilizing a modified duplex preform of this embodiment as described with respect to the embodiment of FIG. 3A above except that the glass 40 comprising the matrix of the duplex preform has conductive metallic particles homogeneously distributed therein in solid solution. Sufficient conductive metallic particles are added to the glass 40 so that the modified duplex preform will conduct an electrical current. A terminal pin 44 disposed in the modified duplex preform will thus be inherently grounded to the body 46 by means of the modified preform. Metallic particles of stainless steel, nickel irons, low carbon irons or complex conductive materials, are advantageously used as the conductive filler for the glass 40 matrix since the CTEs of stainless steel, iron or nickel-iron alloys are mismatched with respect to the CTEs of compression-type glasses. A thirty percent or less addition of such particles to the glass 40 matrix converts the modified preform from an electrically-insulating body to a conductive body, depending upon particle size and distribution.

Duplex preforms according to the present invention form compression glass-to-metal seals of greatly enhanced hermeticity, as described hereinabove.

Numerous modifications and variations of the present invention are possible in light of the above teaching. It is, therefore, to be understood that within the scope of the appended claims, the present invention may be practiced otherwise than as specifically described hereinabove.

What is claimed is:

1. A duplex glass preform for forming hermetic glass-to-metal compression seals, comprising:
   a soft glass matrix, said soft glass matrix having a coefficient of thermal expansion mismatched with respect to coefficients of thermal expansion of metals used to form the hermetic glass-to-metal compression seals and a peripheral interfacing surface for glass-to-metal sealing;
   a dispersion zone in at least one end of said soft glass matrix, said dispersion zone extending inwardly from a surface of said at least one end into said soft glass matrix for a predetermined depth;
   an essentially ceramic-free zone intermediate said dispersion zone and said peripheral interfacing surface; and
   a plurality of ceramic particles selectively distributed said dispersion zone of said soft glass matrix to form a ceramic particle density gradient therein, and wherein said ceramic particle density has a maximum value at said surface of said at least one end and gradually decreases to a near zero value at said predetermined depth.

2. The duplex glass preform according to claim 1 wherein said plurality of ceramic particles further comprises a plurality of alumina particles.

3. The duplex glass preform according to claim 1 wherein said predetermined depth is a value selected from a range of values of about 3 mils to about 15 mils.

4. The duplex glass preform according to claim 3 wherein said value is about 5 mils.

5. The duplex glass preform according to claim 1 wherein said plurality of ceramic particles further comprises a plurality of size-graded ceramic particles having a gradation range of coarse to fine, and wherein said size-graded ceramic particles are selectively distributed so that said coarse to fine gradation range corresponds to said ceramic particle density gradient.

6. The duplex glass preform according to claim 5 wherein said coarse to fine gradation range is about 200 microns to about 50 microns.

7. The duplex glass preform according to claim 1 wherein said soft glass matrix further includes at least one terminal bore therethrough substantially parallel to said peripheral interfacing surface, and wherein said at least one terminal bore has an interfacing surface for glass-to-metal compression sealing, and further including an essentially ceramic-free zone intermediate said terminal bore interfacing surface and said dispersion zone.

8. The duplex glass preform according to claim 7 wherein said soft glass matrix further includes a plurality of conductive metallic particles homogeneously distributed in solid solution therein such that said duplex glass preform is electrically conductive.

9. The duplex glass preform according to claim 8 wherein said plurality of conductive metallic particles further comprises a plurality of particles selected from the group of stainless steel, nickel iron, iron particles and complex conductive materials.

10. The duplex glass preform according to claim 1 further including a dispersion zone in said glass matrix in opposed relation to said dispersion zone in said at least one end.

11. A hermetic glass-to-metal compression sealed package for microcircuit chips, comprising:
    a duplex glass preform, said duplex glass preform further comprising:
    a soft glass matrix having a coefficient of thermal expansion mismatched with respect to coefficients of thermal expansion of metals used to form said hermetic glass-to-metal compression sealed package, a peripheral interfacing surface and at least one terminal bore therethrough substantially parallel to said peripheral interfacing surface, said terminal bore having an interfacing surface;
    a dispersion zone in at least one end of said soft glass matrix, said dispersion zone extending inwardly from a surface of said at least one end into said soft glass matrix for a predetermined depth;
    a first essentially ceramic-free zone intermediate said dispersion zone and said peripheral interfacing surface;
    a second essentially ceramic-free zone intermediate said dispersion zone and said terminal bore interfacing surface, and
    a plurality of ceramic particles selectively distributed in said dispersion zone of said soft glass matrix to form a ceramic particle density gradient therein, and wherein said ceramic particle density has a maximum value at said surface of said at least one end and gradually decreases to a zero value at said predetermined depth;
    a metallic terminal pin correspondingly disposed in said at least one terminal bore and hermetically sealed thereto by compressive stresses, said compressive stresses arising from a mismatch in coefficients of thermal expansion between said duplex glass preform and said metallic terminal pin; and
    a metallic body having at least one aperture therein which receives said duplex glass preform, and wherein said duplex glass preform is hermetically sealed in said body by compressive stresses, said compressive stresses arising from a mismatch in coefficients of thermal expansion between said duplex glass preform and said metallic body.

12. The hermetic package according to claim 11 wherein said plurality of ceramic particles further comprises a plurality of alumina particles.

13. The hermetic package according to claim 11 wherein said terminal pin is formed from a material selected from a group of materials comprised of iron, nickel-iron alloys, stainless steel, noble metal alloys and other suitable non ferrous materials, and wherein said metallic body is formed from a material selected from a group of materials comprised of iron, nickel-iron alloys, stainless steel and other suitable non ferrous materials.

14. The hermetic package according to claim 13 wherein said terminal pin is plated with nickel and further plated with a metal selected from the group of noble metals.

15. The hermetic package according to claim 11 wherein said soft glass matrix further includes a plurality of conductive metallic particles homogeneously distributed in solid solution therein such that said duplex glass preform acts as an electrically conductive pathway between said terminal pin and said body.

16. The hermetic package according to claim 15 wherein said terminal pin and exposed surfaces of said soft glass matrix are plated with nickel and further plated with a metal selected from the noble metal group.

17. The hermetic package according to claim 11 further including a dispersion zone in said soft glass matrix in opposed relation to said dispersion zone in said at least one end.

18. The hermetic package according to claim 11 wherein said plurality of ceramic particles further comprises a plurality of size-graded ceramic particles having a gradation range of coarse to fine, and wherein said size-graded ceramic particles are selectively distributed so that said coarse to fine gradation range corresponds to said ceramic particle density gradient.

* * * * *